(12) United States Patent
Wang et al.

(10) Patent No.: US 11,835,612 B2
(45) Date of Patent: Dec. 5, 2023

(54) SYSTEM AND METHOD FOR MOTION CORRECTION OF MAGNETIC RESONANCE IMAGE

(71) Applicants: University of Cincinnati, Cincinnati, OH (US); Children's Hospital Medical Center, Cincinnati, OH (US)

(72) Inventors: Jinghua Wang, Mason, OH (US); Lili He, Mason, OH (US)

(73) Assignees: University of Cincinnati, Cincinnati, OH (US); Children's Hospital Medical Center, Cincinnati, OH (US)

( * ) Notice: Subject to any disclaimer, the term of this patent is extended or adjusted under 35 U.S.C. 154(b) by 137 days.

(21) Appl. No.: 17/437,467

(22) PCT Filed: Mar. 10, 2020

(86) PCT No.: PCT/US2020/021860
§ 371 (c)(1),
(2) Date: Sep. 9, 2021

(87) PCT Pub. No.: WO2020/185757
PCT Pub. Date: Sep. 17, 2020

(65) Prior Publication Data
US 2022/0187406 A1 Jun. 16, 2022

Related U.S. Application Data

(60) Provisional application No. 62/817,086, filed on Mar. 12, 2019.

(51) Int. Cl.
*G01V 3/00* (2006.01)
*G01R 33/565* (2006.01)
(Continued)

(52) U.S. Cl.
CPC ..... *G01R 33/56509* (2013.01); *G01R 33/482* (2013.01); *G01R 33/5611* (2013.01); *G01R 33/5676* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 6,184,682 B1 * 2/2001 Ehman ...................... G06T 5/50
324/309
8,649,579 B2 2/2014 Griswold et al.
(Continued)

FOREIGN PATENT DOCUMENTS

CN 1515912 A * 7/2004

OTHER PUBLICATIONS

Bydder, et al., "Detection and Elimination of Motion Artifacts by Regeneration of k-Space", Magnetic Resonance in Medicine, vol. 47, pp. 677-686, 2002.

*Primary Examiner* — Walter L Lindsay, Jr.
(74) *Attorney, Agent, or Firm* — DINSMORE & SHOHL LLP

(57) ABSTRACT

A method for motion correction of Magnetic Resonance (MR) images is provided. The method includes acquiring a k-space dataset for an object using an MR scanner, detecting or identifying corrupted k-space data from the acquired k-space dataset, extracting the corrupted k-space data from the acquired k-space dataset, recovering the corrupted k-space data, combining uncorrupted k-space data of the acquired k-space dataset with the recovered k-space data to form a full k-space dataset, and reconstructing an image for the object based on the full k-space dataset. A magnetic (Continued)

resonance imaging system for correcting corrupted k-space data of an entire k-space dataset is also provided.

20 Claims, 7 Drawing Sheets

(51) Int. Cl.
    *G01R 33/48*   (2006.01)
    *G01R 33/561*  (2006.01)
    *G01R 33/567*  (2006.01)
(58) Field of Classification Search
    USPC .......................................................... 324/309
    See application file for complete search history.

(56) References Cited

U.S. PATENT DOCUMENTS

| | | | |
|---|---|---|---|
| 8,934,691 B2 | 1/2015 | Sheltraw | |
| 9,354,289 B2 | 5/2016 | Landschuetz et al. | |
| 9,360,544 B2* | 6/2016 | Huang | A61N 5/00 |
| 9,366,742 B2 | 6/2016 | Kramer et al. | |
| 9,606,209 B2 | 3/2017 | Michael et al. | |
| 9,658,304 B2 | 5/2017 | Lin et al. | |
| 9,714,998 B2 | 6/2017 | Krueger et al. | |
| 9,710,937 B2 | 7/2017 | Haung et al. | |
| 9,846,922 B2 | 12/2017 | Hilbert et al. | |
| 9,857,446 B2 | 1/2018 | Zhang et al. | |
| 9,933,505 B2 | 4/2018 | Pipe | |
| 9,940,713 B1 | 4/2018 | Bhat et al. | |
| 10,004,462 B2 | 6/2018 | Ernst et al. | |
| 10,018,699 B2 | 7/2018 | Beck | |
| 10,067,213 B2 | 9/2018 | Huang et al. | |
| 10,088,545 B2 | 10/2018 | Beck | |
| 10,132,904 B2 | 11/2018 | Beck | |
| 10,185,018 B2 | 1/2019 | Feiweier et al. | |
| 2011/0087090 A1* | 4/2011 | Boernert | A61N 5/1049 600/411 |
| 2012/0002858 A1* | 1/2012 | Huang | G01R 33/5611 382/131 |
| 2012/0082355 A1 | 4/2012 | Mendes et al. | |
| 2015/0212183 A1 | 7/2015 | Beck | |
| 2015/0253409 A1 | 9/2015 | Feiweier et al. | |
| 2015/0323637 A1 | 11/2015 | Marianne | |
| 2016/0018502 A1 | 1/2016 | Wang et al. | |
| 2016/0216352 A1* | 7/2016 | Eggers | G01R 33/5608 |
| 2016/0274209 A1 | 9/2016 | Dannels | |
| 2017/0030990 A1* | 2/2017 | Janich | A61B 5/055 |
| 2017/0309019 A1 | 10/2017 | Knoll et al. | |
| 2018/0033166 A1 | 2/2018 | Cachovan et al. | |
| 2018/0045801 A1 | 2/2018 | Speier | |
| 2018/0059202 A1 | 3/2018 | Bito | |
| 2018/0089826 A1 | 3/2018 | Zhang et al. | |

\* cited by examiner

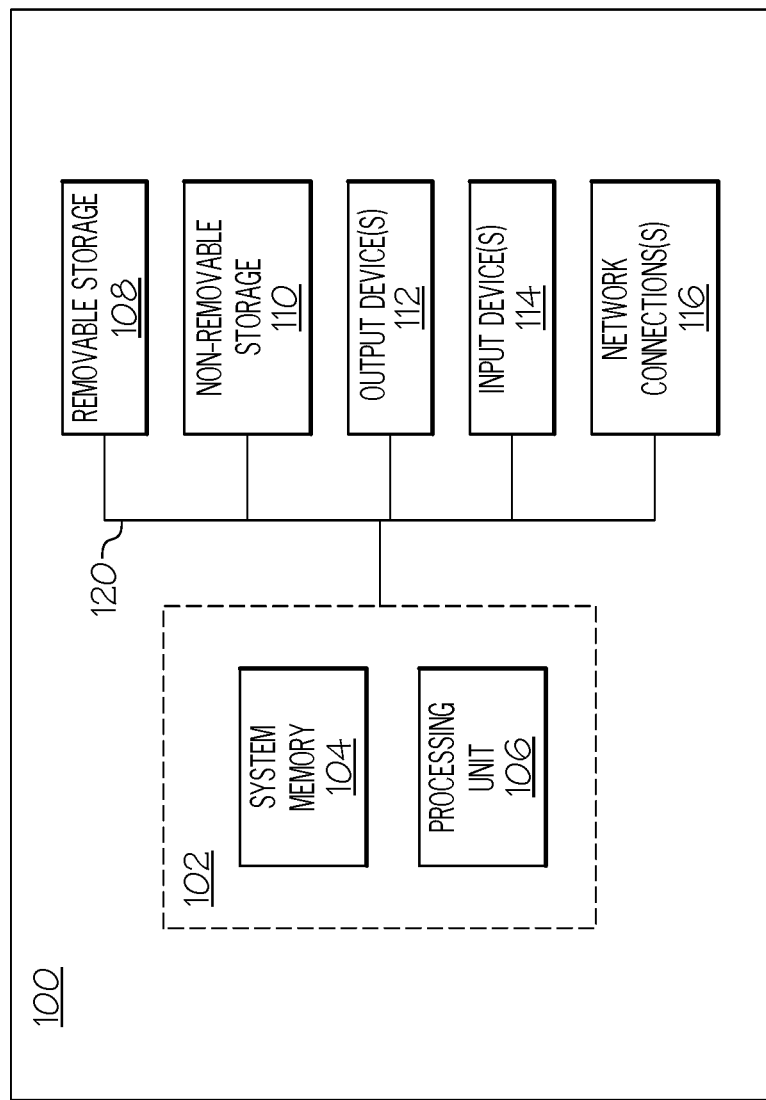

SYSTEM AND METHOD FOR MOTION CORRECTION OF MAGNETIC RESONANCE IMAGE

CROSS-REFERENCE TO RELATED APPLICATION

This application is a National Stage Entry under 35 U.S.C. § 371 of International Patent Application No. PCT/US2020/021860, filed Mar. 10, 2020, which claims benefit of U.S. Provisional Application No. 62/817,086 filed on Mar. 12, 2019, the entire contents of which are herein incorporated by reference.

BACKGROUND

Technical Field

The present disclosure relates to methods and systems for motion correction of magnetic resonance images corrupted due to motions of objects.

Description of the Related Art

Magnetic Resonance Imaging (MRI) is one of the most important modern medical imaging modalities. It has far less risk of side effects than most other imaging modalities such as radioscopy with x-rays or computed tomography because patients and medical personnel are not subjected to ionizing radiation exposure in the procedure. The use of MRI has grown very fast. Every year, more than 30 million MRI scans are performed in the United States, and more than 60 million MRI scans are performed worldwide. Doctors often recommend MRI for the diagnosis of various diseases, such as tumors, strokes, heart problems, neurodegenerative diseases, and spine diseases. A high-quality scan is important for maximizing diagnostic sensitivity and accuracy, and accurately assess treatment responses. Generally, high quality images are characterized by high signal to noise ratio (SNR), high contrast between normal and pathological tissues, low levels of artifacts, and appropriate spatial-temporal resolution In order to obtain a detectable magnetic resonance (MR) signal, the object to be examined is positioned in a homogeneous static magnetic field so that the object's nuclear spins generate net magnetization oriented along the static magnetic field. The net magnetization is rotated away from the static magnetic field using a radio frequency (RF) excitation field with the same frequency as the Larmor frequency of the nucleus. The angle of rotation is determined by the field strength of the RF excitation pulse and its duration. In the end of the RF excitation pulse, the nuclei, in relaxing to their normal spin conditions, generate a decaying signal (the "MR signal") at the same radio frequency as the RF excitation. The MR signal is picked up by a receive coil, amplified and processed. The acquired measurements, which are collected in the spatial frequency domain, are digitized and stored as complex numerical values in a "k-space" matrix. An associated MR image can be reconstructed from the k-space data, for example, by an inverse 2D or 3D fast Fourier transformation (FFT) from the raw k-space data.

One major challenge of the MRI is the relatively long acquisition time in order to obtain high quality, diagnostically interpretable images. Unfortunately, the duration of the data acquisition is long enough (e.g., the order of a few seconds) for organ motions such as cardiac motions, respiration, blood flow, peristalsis or restlessness to cause artifacts such as blurring and replication, commonly termed as ghosting, in the reconstructed image. These artifacts can lead to poor image quality, repeated scans, and decreased throughput. Therefore, motions of objects are one of major challenges for the application of MR imaging in research and clinical practices. Specifically, the elderly and pediatric patient population or patients with medical conditions (Parkinson disease, seizure, stroke) are very difficult to hold still, and effective strategies for motion correction are paramount. Though faster and more sophisticated fast imaging techniques have been developed in a past decade, tissue motion remains one of the major sources of artifacts and significant problem in magnetic resonance imaging (MRI) with high clinical and public health costs because MRI exams have relatively long scan times that can result in increased vulnerability to motion artifacts. The motions during MRI exams can result from bulk patient motion, cardiac motion, respiration, and flow (e.g. CSF and blood). Theses motions, including flow, translation, rotation and non-rigid motions, may appear not only in-plane and through-plane of images, but also in between-scan (or intra-scan) and within-scan (inter-scan). Particularly, small subject motions can degrade image quality at high spatial resolution that negatively impacts radiological interpretation. Even in cooperative subjects, very high-resolution imaging may benefit from the correction of small motion during prolonged scans. These motions can lead to severe degradations of the image quality which includes image ghosts, blurring, phase error, signal loss, contrast loss, mis-registration. The motion artifacts may lead to errors in determining the size of a lesion, determining the location of the lesion, or quantifying the lesion. As a result, they may lead to a missed or misinterpreted diagnosis, and the need for patient sedation, restraint, or rescanning. It is very difficult to calculate the cost of motions in MRI exams because of the complex and non-transparent hospital costs, the current reimbursement scale, the variability in sedation requirements, hospital referral and practice patterns. The previous study indicated that motion artifacts potentially affects up to 31% of neuroaxis MR examinations. Conservatively estimated cost to the hospital in correcting patient motion may be around $100,000 per scanner and per year (https://cds.ismrm.org/protected/Motion_14/Program/Videos/10850). Motion artifacts have strongly affected the clinical practice of MRI images and substantially increased the cost of healthcare. Numerous techniques for removing these artifacts are disclosed in the following references:

U.S. Pat. No. 8,649,579 B2 to Mark A. Griswold et al. discloses systems, and methods for removing motion artifacts from MR images. The method includes controlling an MRI apparatus to acquire a fully sampled, centric-ordered, non-interleaved, data set; controlling a Generalized Auto-Calibrating Partially Parallel Acquisition (GRAPPA) logic to produce a GRAPPA duplicate of a single partition through the data set; computing, from the GRAPPA duplicate, a GRAPPA navigator for a phase encoding (PE) line in the single partition and computing an error between the PE line in the single partition and a corresponding PE line in the GRAPPA duplicate using the GRAPPA navigator; selectively replacing data in the PE line in the single partition with replacement data upon determining that the error exceeds a threshold, and reconstructing an MR image based, at least in part, on the single partition.

U.S. Pat. No. 8,934,691 B2 to Daniel James Sheltraw discloses a system compensates for patient motion artifacts in MR imaging. The method includes acquiring first data representing individual frequency components of a segment of a k-space storage array during a first time period and second data representing individual frequency components of the segment of the k-space storage array during a second time period subsequent to the first time period; measuring motion parameters between the first data and second data; comparing the calculated measure with a predetermined threshold value, and generating an image using acquired individual frequency components of adjacent segments of the k-space storage array excluding frequency components of the first data and second data in response to said calculated measure exceeding said predetermined threshold value.

U.S. Patent Application Publication No. 2015/0323637A1 to Gabriele Marianne Beck et al. discloses a method and apparatus to correct motion artifacts in MRI images using navigators acquired using a dixon technique. The method includes acquiring imaging signals; implementing a navigator sequence applied at least once before, during, or after the imaging sequence; acquiring navigator signals by means of a single-point or multi-point Dixon technique; deriving translation and/or rotation and/or shear data from the navigator signals, which translation and/or rotation and/or shear data reflect motion occurring within the portion of the body; reconstructing a MR image from the imaging signals wherein the translation and/or rotation data are used for adapting the imaging sequence and/or for motion correction during reconstruction of the MR image.

U.S. Pat. No. 9,366,742 to Aletta J. W. Kramer et al. discloses an MRI apparatus or system for compensating for motion of a region-of-interest. The method includes estimating a motion pattern of a region of interest (ROI) by selecting a fixed point at an anatomical position; adjusting the gradients and the bandwidth of the RF pulses of the MR system in the acquisition sequence to avoid or reduce motion artefacts.

U.S. Pat. No. 9,354,289 B2 to Wilfried Landschuetz and Peter Speier discloses a method and apparatus to reduce movement artifacts in MM images. The method teaches that the motion reduction can be conducted by weighted factors of two images. One image of unmoving area of a region is acquired by a first group coils, and another image of a moving area is acquired by a second group coils. The weighting factors are determined so as to reduce gradient of the weighted, combined, spatially dependent coil sensitivity of the second group coils.

U.S. Pat. No. 10,132,904 B2 to Thomas Beck discloses a method for creating an image with prospective motion correction with a recording of navigation signals. The method includes recording navigator reference signals; determining motion information; determining an influence of the residual magnetization on the plurality of partial volumes; and creating an image with different weightings of the navigator volume.

U.S. Pat. No. 9,606,209 B2 to Thomas Michael Ernst and Oliver Speck discloses systems and methods for intra-scan motion correction. The method includes detecting motion of a subject and generating motion data corresponding to the motion of the subject by a motion tracking system; updating geometry parameters and encoding gradient parameters; correcting motion artifacts using updated geometry parameters and encoding parameters.

U.S. Pat. No. 9,710,937 B2 discloses a retrospective motion correction method and system of MRI images. The method includes reconstructing a first image from the magnetic resonance data which includes a high signal to noise ratio and motion artifacts; detecting and rejecting portions of k-space which include non-rigid motion defects; and reconstructing a second image from non-rejected portions of k-space and the first image.

U.S. Pat. No. 9,846,922 B2 to Tom Hilbert and Gunnar Krueger discloses a method and apparatus for detecting phase-encoding ghosting and the corresponding artifact in the MR image. The method includes acquiring MRI raw data; calculating an artifact map from the MRI raw data; creating an outlier mask representing detected phase-encoding artifact in the artifact map; and reducing the phase-encode ghosting in the MR image by using the previously obtained artifact map and the outlier mask.

U.S. Pat. No. 9,714,998 B2 to Gunnar Krueger and David Piccini discloses a method and apparatus for prospective motion detection and correction of subject/object MRI images during MRI exam. The method includes detecting time-points in which motion has occurred; creating interleaves automatically; arranging k-space MRI data into several groups of interleaves of uniform k-space sampling; reconstructing separately each subset of interleaves for obtaining low resolution MR images; determining motion parameters using the low-resolution images by registration to a predetermined reference image; and improving a quality of images using the motion parameters.

U.S. Pat. No. 9,658,304 to Wei Lin and Feng Huang discloses a retrospective motion correction method of MRI images acquired with a plurality of interleaved magnetic resonance radial acquisition datasets. The method includes reconstructing each magnetic resonance radial acquisition dataset into a corresponding image to generate a set of images using a generalized auto-calibrating partially parallel acquisition (GRAPPA) operator; selecting a reference; performing three-dimensional spatial registration of each image of the set of images; and combining the spatially registered set of images to generate a motion corrected image.

U.S. Pat. No. 10,088,545 B2 to Thomas Beck discloses a method and apparatus for prospective motion correction of MRI. This patent teaches that motion correction parameters are determined based on a comparison of magnetic resonance data with reference magnetic resonance data. Magnetic resonance data are corrected using prospective motion correction based on the motion correction parameters.

U.S. Pat. No. 10,018,699 B2 to Thomas Beck discloses a method and apparatus for prospective motion correction of MRI. This patent teaches that MR signal of an examination volume and a navigator volume is established at different time frames, and motion information is determined from the navigator signal and the navigator reference signal. The motion of the examination volume can be corrected using the motion information.

U.S. Pat. No. 9,940,713 B1 to Himanshu Bhat et al. discloses a prospective method for MRI inter-scan motion correction. This patent teaches that motion correction of MRI images can be conducted using anatomical landmarks as a reference navigator to determine an estimation of inter-scan patient motion.

U.S. Patent Application Publication No. 2018/0033166 A1 to Michal Cachovan and Alexander Hans Vija discloses a method for intra reconstruction motion correction in medical image processing and generation of multi-modalities.

U.S. Pat. No. 10,004,462 B2 to Thomas Michael Ernst et al. discloses methods, systems, and devices for removing prospective motion correction from medical imaging scans using the motion tracking data, to compensate in real time for object motion, such that raw image data generated by the scanner can be reconstructed into motion-corrected images.

U.S. Pat. No. 10,067,213 B2 to Feng Huang and Wei Lin discloses a method for rigid motion compensation of parallel MRI techniques using calibration scan, coil sensitivity maps and navigators.

U.S. Patent Application Publication No. 2015/0323637A1 to Gabriele Marianne Beck et al. discloses a method to correct motion artifacts using a navigator sequence which can be used for determining and acquiring translation and/or rotation and/or shear data.

U.S. Pat. No. 9,933,505 B2 to James Grant Pipe discloses systems and methods for motion correction of MR images. The patent teaches the method to acquire data with the MRI system by sampling k-space as a series of blades that are rotated in k-space with respect to each other. A relative shift value between the first blade and the second blade is calculated to correct the selected blades. An image is then reconstructed from the motion-corrected blades.

U.S. Patent Application Publication No. 2018/0045801 A1 to Peter Speier discloses a method for estimating movement information relating to an examination region of a patient using an electromagnetic signal received by a reception circuit. This patent teaches a method for estimating motion information.

U.S. Patent Application Publication No. 2018/0089826A1 to Li Zhang et al. discloses methods and systems for utilizing patient respiratory signals and 3D deformable registration in order to provide three-dimensional motion correction for two-dimensional acquisition based MR sequences, such as diffusion weighted imaging.

U.S. Pat. No. 9,857,446 B2 to Tao Zhang et al. discloses a method for motion correction of MRI image of an object in an MRI system with an array of a plurality of receiving coils and individual navigator data. MRI image is reconstructed using the determined motion estimate from coils in the found subset.

U.S. Pat. No. 10,185,018 A1 to Thorsten Feiweier et. al discloses a prospective method and apparatus for motion correction in magnetic resonance imaging during MRI exams. This patent teaches that the position of planned measurement volumes can be kept coherent with a desired anatomy irrespective of object motion and across different scans.

The paper 'Detection and elimination of motion artifacts by regeneration of k-space. Magn Reson Med. 2002; 47(4): 677-686' to Mark Bydder et al. discloses a retrospective motion correction method by discarding motion-corrupted data and filling the resulting parts of k-space using parallel imaging techniques. The method can improve the quality of the reconstructed images.

Unfortunately, motion correction is still unsolved problem in MRI imaging though a lot of methods, including prospective and retrospective motion correction methods, have been proposed and applied to reduce the motion artifacts in an MRI system.

SUMMARY

Described herein are methods and systems for correcting corruption of magnetic resonance images due to motions of an object.

In one embodiment, a method for motion correction of Magnetic Resonance (MR) images is provided. The method includes acquiring a k-space dataset for an object using an MR scanner, detecting or identifying corrupted k-space data from the acquired k-space dataset, extracting the corrupted k-space data from the acquired k-space dataset, recovering the corrupted k-space data, combining uncorrupted k-space data of the acquired k-space dataset with the recovered k-space data to form a full k-space dataset, and reconstructing an image for the object based on the full k-space dataset.

In another embodiment, a magnetic resonance imaging (MRI) system includes a magnetic field generating unit configured to apply a plurality of RF pulses with a E to a target area in the object, a receiver configured to receive MR signals from the target area, a processing unit, a system memory, and machine readable instructions stored in the system memory that, when executed by the processing unit, cause the processing unit to: acquire a k-space dataset for the target area based on the MR signals, detect or identify a corrupted k-space data from the acquired k-space dataset; extract the corrupted k-space data from the acquired k-space dataset, recover the corrupted k-space data, combine uncorrupted k-space data of the acquired k-space dataset with the recovered k-space data to form a full k-space dataset, and reconstruct an image for the target area based on the full k-space dataset.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

FIG. 1A is an example computing device, according to one or more embodiments shown and described herein;

DETAILED DESCRIPTION

1. Definition

Figure 1:
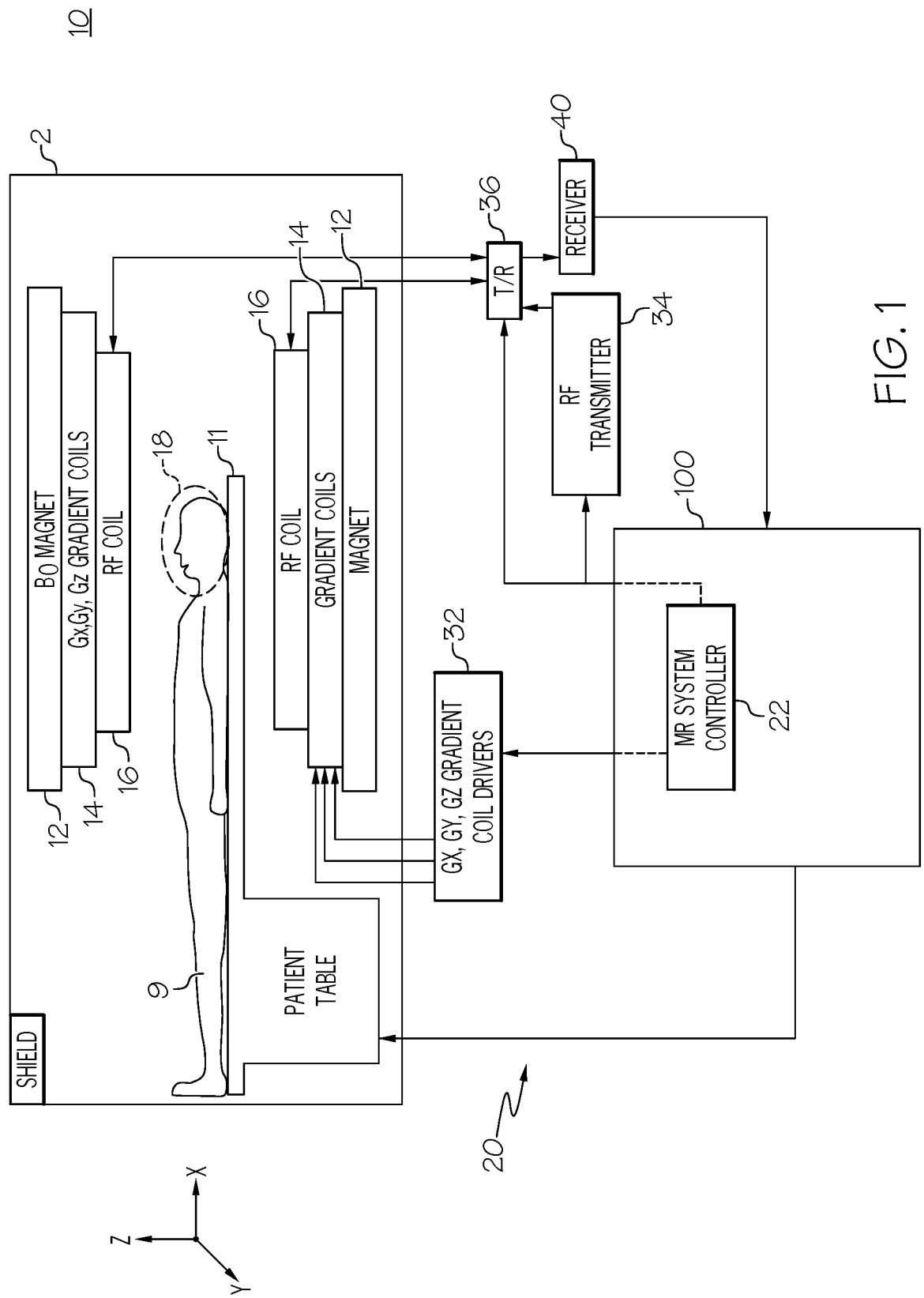
FIG. 1 is a diagram illustrating an example MRI system, according to one or more embodiments shown and described herein.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. While implementations will be described for optimizing MRI scanner settings (also referred to herein as "basic scanner settings"), MRI protocols, variable flip angle, k-space strategy, and/or imaging parameters with regard to MRI modalities, it will become evident to those skilled in the art that the implementations are not limited thereto, but are applicable to other image modalities such as, computed tomography, for example. Additionally, this disclosure contemplates that MRI modalities include MRI techniques with administration of contrast agents, for example, contrast enhanced MR angiography. This disclosure contemplates that the images obtained using the techniques described herein can be directly employed in at least one of diagnosing diseases, monitoring prognosis and therapeutic responses, conducting treatment plans, and improving quantification of MRI. For example, the techniques described herein can be used for the diagnoses of specific diseases such as the standardization of the MRI protocol in The Alzheimer's Disease Neuroimaging Initiative. Additionally, the techniques described herein are optionally applicable to a group of individuals in a similar pathophysiological situation.

The term "each acquisition" and variations thereof as used herein is used synonymously with the term "each k-space line" or "each phase-encoding" or "each readout radiofrequency pulse" or "each echo" or "each readout gradient pulse" and variations thereof and are open, non-limiting terms.

The term "k-space" and variations (such as frequency domain or raw data) thereof as used herein indicate the data space in which MRI raw data is acquired. The k-space represents the spatial frequency information in two or three dimensions of an object. The k-space is defined as a space covered by the phase and frequency encoding data. In contrast to this, the Fourier-transformed counterpart of the k-space is defined as an image space or image domain. The relationship between k-space data and image data is the Fourier transformation. Each data point in k-space represents a different superposition of the tissue signals. Every point in the raw data matrix contains part of the information for the complete image. A point in the raw data matrix does not correspond to a point in the image matrix. The high spatial frequency components provide information about the borders and contours of the image, the detail of the structures. The low spatial frequency components provide information on the general contrast of the image.

The term "k-space trajectory" and variations thereof as used herein indicate the path traced in k-space domain during MRI data collection. The k-space trajectory is used to illustrate the acquisition strategy. It has great influences on artifacts and the image reconstruction.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation.

The term "intra-scan" and variations thereof as used herein indicate MRI exams at the different time frames or longitudinal MRI exams.

The term "inter-scan" and variations thereof as used herein indicate an MRI exam which can be two dimensional and three dimensional MRI imaging.

The term "prospective" and variations thereof as used herein indicate that prevents motion artifacts by capturing k-space at consistent times and consistent location over multiple periods of motion.

The term "retrospective" and variations thereof as used herein indicate that records k-space dataset continuously and then corrects motion artifacts by transformation matrix, k-space data rejection and interpolation)

The term "reconstructing image" and variations thereof as used herein indicate a process is to transform the acquired k-space data (e.g. raw data) into images.

The term "functional system" and variations thereof as used herein includes but is not limited to hardware, software to perform a function and/or an action.

The term "reconstruction" and variations thereof as used herein indicate a mathematical process that generates MRI images from incomplete raw data acquired at many different conditions to improve image quality and reduce the artefacts.

2. MRI System Overview

FIG. 1 depicts an MRI system 10, according to one or more embodiments described and shown herewith. In embodiments, the MRI system 10 shown in FIG. 1 includes a patient table 11, a static magnetic field generating unit 12, a gradient magnetic field generating unit 14 for generating respective magnetic fields in proximity to a target area 18 of an object 9, a transmitting and receiving unit 16, and a computing device 100. The patient table 11, the static magnetic field generating unit 12, the gradient magnetic field generating unit 14, and the transmitting and receiving unit 16 are placed within MRI RF shielding area 2 where noise of radio frequency is prevented from entering.

The static magnetic field generating unit 12 includes a main magnet configured to generate a strong static magnetic field in proximity to the target area 18 of the object 9. The static magnetic field generating unit 12 may be arranged to surround the target area 18 of the object 9. For example, the static magnetic field generating unit 12 may be a cylindrical-shaped unit. The gradient magnetic field generating unit 14 includes gradient magnetic field coils for generating gradient magnetic fields in an x-axis direction, a y-axis direction, and a z-axis direction, which are orthogonal to each other. The gradient magnetic field generating unit 14 may be arranged to surround the target area 18 of the object 9. For example, the gradient magnetic field generating unit 14 may be a cylindrical-shaped unit.

In embodiments, the transmitting and receiving unit 16 may include a transmission coil and a receiving coil. The transmission coil irradiates RF pulses to the object 9 and the receiving coil receives MR signals generated by the object 9. In some embodiments, the transmitting and receiving unit 16 may include a transceiver coil having the functions of both the transmission coil and the receiving coil. The receiving coil may be composed of, for example, a so-called array coil in which, for example, a plurality of coil elements are disposed to detect the MR signals generated by the object 9. An RF transmitter 34 may control the transmission coil of the transmitting and receiving unit 16 to irradiate RF pulses. A receiver 40 may receive MR signals generated by the object 9 from the receiving coil of the transmission and receiving unit 16. The RF transmitter 34 and the receiver 40 may communicate with the transmitting and receiving unit 16 through a transmitter/receiver interface 36.

In embodiments, the MRI system 10 includes the computing device 100. The computing device 100 includes a MRI system controller 22. The MRI system controller 22 may control the operations of the gradient coil drivers 32 that activate the gradient coils of the gradient magnetic field generating unit 14. The MRI system controller 22 may also control the operations of the RF transmitter 34 that activates the RF coil of the static magnetic field generating unit 12. The computing device 100 may receive MR signals from the receiving coil of the transmission and receiving unit 16 and reconstruct an MRI image based on the received MR signals. The details of the computing device 100 will be further described with reference to FIG. 1A below.

In embodiment, the computing device 100 may be operably coupled to other components of the MRI system 10, for example, using by any medium that facilitates data exchange between the components of the MRI system 10 and the computing device 100 including, but not limited to, wired, wireless and optical links. For example, the computing device 100 may convert the MR signals received from the transmitting and receiving unit 16 into k-space data. The computing device 100 may generate MR image data from the k-space data with image reconstruction processing. In some embodiments, the techniques for improving image quality with optimal variable flip angles may optionally be implemented using the MRI system 10.

3. Example Computing Device

FIG. 1A depicts a computing device 100 according to one or more embodiments shown and described herein. It should be appreciated that the logical operations described herein with respect to the various figures may be implemented (1) as a sequence of computer implemented acts or program modules (i.e., software) running on a computing device (e.g., the computing device described in FIG. 1A), (2) as interconnected machine logic circuits or circuit modules (i.e., hardware) within the computing device and/or (3) a combination of software and hardware of the computing device. Thus, the logical operations discussed herein are not limited to any specific combination of hardware and software. The implementation is a matter of choice dependent on the performance and other requirements of the computing device. Accordingly, the logical operations described herein are referred to variously as operations, structural devices, acts, or modules. These operations, structural devices, acts and modules may be implemented in software, in firmware, in special purpose digital logic, and any combination thereof. It should also be appreciated that more or fewer operations may be performed than shown in the figures and described herein. These operations may also be performed in a different order than those described herein.

It should be understood that the computing device 100 is only one example of a suitable computing environment upon which embodiments of the invention may be implemented. Optionally, the computing device 100 may be a well-known computing system including, but not limited to, personal computers, servers, handheld or laptop devices, multiprocessor systems, microprocessor-based systems, network personal computers (PCs), minicomputers, mainframe computers, embedded systems, and/or distributed computing environments including a plurality of any of the above systems or devices. Distributed computing environments enable remote computing devices, which are connected to a communication network or other data transmission medium, to perform various tasks. In the distributed computing environment, the program modules, applications, and other data may be stored on local and/or remote computer storage media.

In embodiments, the computing device 100 includes a controller 102 that includes one or more processing units 106 and one or more system memory modules 104. The controller 102 may be the same controller as the MRI system controller 22 in FIG. 1. In other embodiments, the controller 102 may be a separate controller from the MRI system controller 22 in FIG. 1. Depending on the exact configuration and type of computing device, the one or more memory modules 104 may be volatile (such as random access memory (RAM)), non-volatile (such as read-only memory (ROM), flash memory, etc.), or some combination of the two. The one or more processing units 106 may be a standard programmable processor that performs arithmetic and logic operations necessary for operation of the computing device 100.

In embodiments, the computing device 100 includes communication path 120 that provides signal interconnectivity between various components of the computing device 100. Accordingly, the communication path 120 may communicatively couple any number of processing units 106 with one another, and allow the components coupled to the communication path 120 to operate in a distributed computing environment. Specifically, each of the components may operate as a node that may send and/or receive data. As used herein, the term "communicatively coupled" means that coupled components are capable of exchanging data signals with one another such as, for example, electrical signals via conductive medium, electromagnetic signals via air, optical signals via optical waveguides, and the like.

Accordingly, the communication path 120 may be formed from any medium that is capable of transmitting a signal such as, for example, conductive wires, conductive traces, optical waveguides, or the like. In some embodiments, the communication path 120 may facilitate the transmission of wireless signals, such as Wi-Fi, Bluetooth, Near Field Communication (NFC) and the like. Moreover, the communication path 120 may be formed from a combination of mediums capable of transmitting signals. In one embodiment, the communication path 120 comprises a combination of conductive traces, conductive wires, connectors, and buses that cooperate to permit the transmission of electrical data signals to components such as processors, memories, sensors, input devices, output devices, and communication devices. Accordingly, the communication path 120 may comprise a vehicle bus, such as for example a LIN bus, a CAN bus, a VAN bus, and the like. Additionally, it is noted that the term "signal" means a waveform (e.g., electrical, optical, magnetic, mechanical or electromagnetic), such as DC, AC, sinusoidal-wave, triangular-wave, square-wave, vibration, and the like, capable of traveling through a medium.

The one or more processing units 106 may be configured to execute program code encoded in tangible, computer-readable media. Tangible, computer-readable media refers to any media that is capable of providing data that causes the computing device 100 (i.e., a machine) to operate in a particular fashion. Various computer-readable media may be utilized to provide instructions to the one or more processing units 106 for execution. Example tangible, computer-readable media may include, but is not limited to, volatile media, non-volatile media, removable media and non-removable media implemented in any method or technology for storage of information such as computer readable instructions, data structures, program modules or other data. One or more system memory modules 104, a removable storage 108, and a non-removable storage 110 are all examples of tangible, computer storage media. Tangible, computer-readable recording media may include, but are not limited to, an integrated circuit (e.g., field-programmable gate array or application-specific IC), a hard disk, an optical disk, a magneto-optical disk, a floppy disk, a magnetic tape, a holographic storage medium, a solid-state device, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices.

In embodiments, the one or more processing units 106 may execute program code stored in the one or more system memory modules 104. For example, a bus may carry data to the one or more system memory modules 104, from which the one or more processing units 106 receive and execute instructions. The data received by the one or more system memory modules 104 may be optionally stored on the removable storage 108 or the non-removable storage 110 before or after execution by the processing unit 106.

In embodiments, the computing device 100 may include additional storage such as removable storage 108 and non-removable storage 110 including, but not limited to, magnetic or optical disks or tapes.

The computing device 100 may also have input device(s) 114 such as a keyboard, mouse, touch screen, etc. The input device may be manipulated by an operator to input signals to the MRI apparatus to set the imaging method group, the performing order, the imaging condition, and the like. The computing device 100 may also have output device(s) 112 such as a display, speakers, printer, etc. The output device 112 may output image data such as local image data, diagnosis image data using display, printer and other displayer. The additional devices may be connected to the bus in order to facilitate communication of data among the components of the computing device 100.

Computing device 100 may also contain network connection(s) 116 that allow the device to communicate with other devices. The network connection(s) 116 may be any device capable of transmitting and/or receiving data via a wireless network. Accordingly, the network connection(s) 116 may include a communication transceiver for sending and/or receiving data according to any wireless communication standard. For example, the network connection(s) 116 may include a chipset (e.g., antenna, processors, machine readable instructions, etc.) to communicate over wireless computer networks such as, for example, wireless fidelity (Wi-Fi), WiMax, Bluetooth, IrDA, Wireless USB, Z-Wave, ZigBee, or the like.

It should be understood that the various techniques described herein may be implemented in connection with hardware or software or, where appropriate, with a combination thereof. Thus, the methods and apparatuses of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

In some embodiments, the computing device 100 may include a workflow setting unit, an imaging operation determining unit, and an image reconstruction unit. The workflow setting unit may be a program module stored in the system memory modules 104. The workflow setting unit sets a first workflow relating to the MRI examination by estimating an imaging time of each of the imaging methods in the performing order initially set by a scan plan. Further, the workflow setting unit sets a second workflow relating to the MRI examination by estimating a shortest performing order, by which an examination time necessary to sequentially perform a plurality of imaging methods constituting the imaging method group set by, the input unit is minimized. The imaging operation determining unit determines whether an imaging operation during a main imaging is implemented according to the workflow. In embodiments, the workflow setting unit and/or the imaging operation unit may be implemented using hardware, software, and or a combination thereof.

The image reconstruction unit may include an MR signal storage unit, a signal processing unit, and an image data storage unit. The MR signal storage unit (e.g., memory) stores the MR signals, which are collected by the receiver unit of the transmitting and receiving unit 16. The signal processing unit has an image reconstruction processing unit and an image processing unit. The image reconstruction processing unit generates image data from the MR signal storage unit by image reconstruction processing, for example, performed by a Fourier transformation such as 2D FFT. When the MR signals to a three-dimensional region are collected, the image reconstruction processing unit of the signal processing unit generates volume data. Subsequently, the image processing unit generates three-dimensional image data such as volume rendering image data, surface rendering image data and the like or two-dimensional image data, multi planar reconstruction image data, and the like, because predetermined image processing is performed for the volume data generated by the image reconstruction processing unit. Then, the image data described above obtained by the signal processing unit are stored to the respective storage regions of the image data storage unit.

4. Overview

Three major challenges dealing with motion correction are: the exact motion detection; obtaining accurate motion parameters (in a rigid body model, 6 parameters/degrees of freedom); and correcting the motion corrupted data. Over past decades, various motion correction approaches have been applied to deal with these issues and reduce the motion artifacts, which may be categorized as three categories of motion correction strategies: (1) fast imaging acquisition (such as echo planar imaging, partial Fourier acquisition, parallel imaging and compress sense) to freeze the patients' motion; (2) Prospective motion correction methods that use motion information detected by MRI methods (navigator techniques) or external sensors (such as optical markers and cameras) during the MRI scan; (3) Retrospective motion correction methods that depend on either data self-consistency or on motion information. In analogy to photography, shortening the image acquisition time below the typical time scale of motion is the most straightforward approach to reduce motion artifacts.

Prospective methods, such as external MRI-compatible tracking devices (respiratory bellows, electrocardiogram, peripheral gate, locator coils, and optical tracking) and MR detection (image navigators and 2D or 3D translational motion correction), use motion-tracking data acquired during the scan to correct corrupted k-space data directly. The prospective methods attempt to adjust the scan plane (ideally in real-time and with little time lag) to pose changes prior to acquiring individual k-space lines. The main advantages of prospective methods is not only that scan time is not increased, but also that motion correction is independent on the sequence used for acquisition. Additionally, prospective methods greatly reduces and compensates automatically spin-history effects which occur when tissue moves in and out of the slice being imaged. However, such external device is not commonly available and has the problem of extra hardware cost and maintenance. Such external device can be both time consuming and relatively complex. Without the use of external device, another prospective motion methods acquire extra MR-data (e.g. navigators or navigator echoes) before or after the actual imaging part of the sequence with the specific purpose of quantifying motion during the scan to estimate the amount of motion. The prospective methods have an advantage in compatibility with most imaging sequences and use of the standard reconstruction methods. However, navigator techniques require additional acquisition time. The prospective methods can avoid Nyquist violations in the presence of large rotations and guarantee sufficiently dense sampling of k-space. Finally, the prospective methods can reduce spin history effects together with the fact that the desired imaging volume is fully covered throughout the scan. However, there exists some major challenges for prospective methods, such as precision, accuracy and latency) of tracking data. The accuracy of the motion estimate is mainly limited by the interval time between the motion estimate and data acquisition, resulting in the error of prospective correction. Additionally, uncorrected effects, such as B0 in-homogeneities and gradient nonlinearities, can lead to residual artifacts after prospective motion correction. Finally, higher order motion (e.g., velocity, rather than displacement) is typically not accounted for in traditional prospective motion correction implementations. A major challenge for prospective motion correction is however to assure signal stability.

Retrospective methods, known as auto-correction, such as self-navigation and autofocus, extract motion information after the image is fully acquired. These methods may correct corrupted image data afterward by reconstruction model or iterative algorithms (e.g., optimizing image entropy, gradient entropy or other measures of artifacts). These methods detect and reconcile k-space data inconsistencies by estimating the point spread function, the correlation of adjacent k-space lines and self-navigated data acquisition technique. To apply rigid-body retrospective motion correction all that is needed is to apply a rigid body transformation. Retrospective motion correction is good at correcting in-plane motion for 2D acquisitions. An advantage of this process is that motion artifact reduction can be performed on all image data types, eliminating the need for specialized hardware, tailored pulse sequences, and theoretically the cooperation of the patient. However, retrospective methods have the following limitations: (1) it is not able to correct for any type of trough-plane motion (e.g., nodding or shifts) because through-plane motion of causes a severe violation of k-space consistency. Even subtle spin history effects from through-plane motion can have profound effects on the performance of retrospective motion correction (2) On the other hand, the retrospective method does not guarantee sufficiently dense sampling of k-space in the presence of large rotations, leading to Nyquist violations. However, each method has thus far been employed to correct artefacts in spin echo imaging or spin echo, echo planar imaging employing only two-dimensional (2D) acquisition sequences.

5. Theory

Generally, magnetic resonance image signal without relaxation time effect can be described by:

$$s(\vec{k}) = \int \rho(\vec{r}) e^{-i\vec{k}\cdot\vec{r}} \cdot d\vec{r}^3 \qquad \text{Equation (1)}$$

Where k is the spatial frequency and $\rho(\vec{r})$ is nuclear spin density at the location of $\vec{r}$. According to Hermitian symmetry, the following is obtained:

$$s(\vec{k}) = S^*(-\vec{k}) \qquad \text{Equation (2)}$$

Most of conventional motion correction methods performs the motion correction according to the motion parameters obtained in image domain. For example, some correction methods based on the suboptimal phase information of the uncorrupted data. The Fourier transform between image domain and k-space domain often introduces truncation artifacts, especially for low resolution image. The present disclosure conducts the motion correction in k-space domain. According to the Fourier theorems, a translation of the object leads to a phase ramp in the acquired k-space and an object rotation corresponds to a rotation of k-space. Therefore, the present disclosure conducts the motion correction in k-space domain.

Image Evaluation

A successful evaluation metric should be a quantitative measure of image quality. The metric must be either a minimum or maximum, ideally corresponding to the motion-free image. Eight metrics that have been successfully employed to autofocusing applications in the field of confocal microscopy. Most recently, image entropy has been used as the metric for auto-correction of a limited number of volunteer and MR patient exams.

To evaluate the image quality of the reconstructed images, the distribution of error in magnitude between the reconstructed and reference images at each pixel are compared visually and quantitatively using the ratio of the root mean square error (RMSE) to the sum of the signal intensity of a reference image. RMSE is defined as:

$$RMSE = \frac{\sqrt{\Sigma(I_{rec} - I_{ref})^2}}{\Sigma I_{ref}}$$

where $I_{ref}$ is the reference image reconstructed from full k-space and $I_{rec}$ is the image reconstructed from partial k-space acquisition. RAISE results from image noise, artifacts and resolution. In this study, we also compared the performance of our method with zero-filling method which is widely applied by MRI scanner manufactures.

6. Examples

Figure 2:
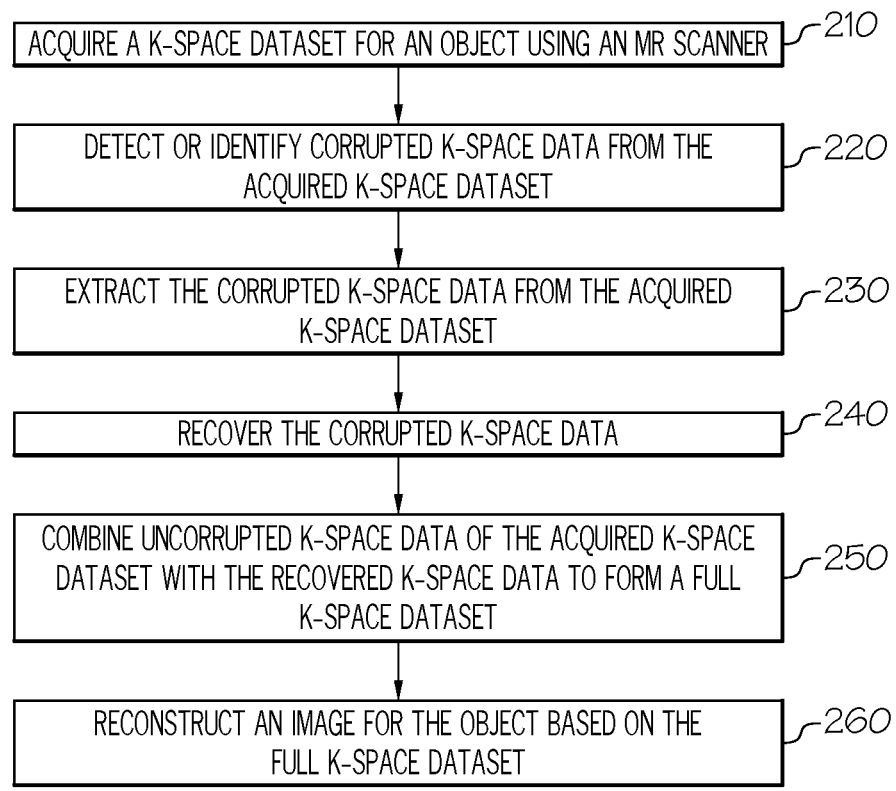
FIG. 2 is a schematic flowchart of recovering corrupted k-space data of acquired k-space dataset according to one or more embodiments shown and described herein.

FIG. 2 is a schematic flowchart of correcting corrupted k-space data of acquired k-space dataset according to one example in the present disclosure.

Figure 3:
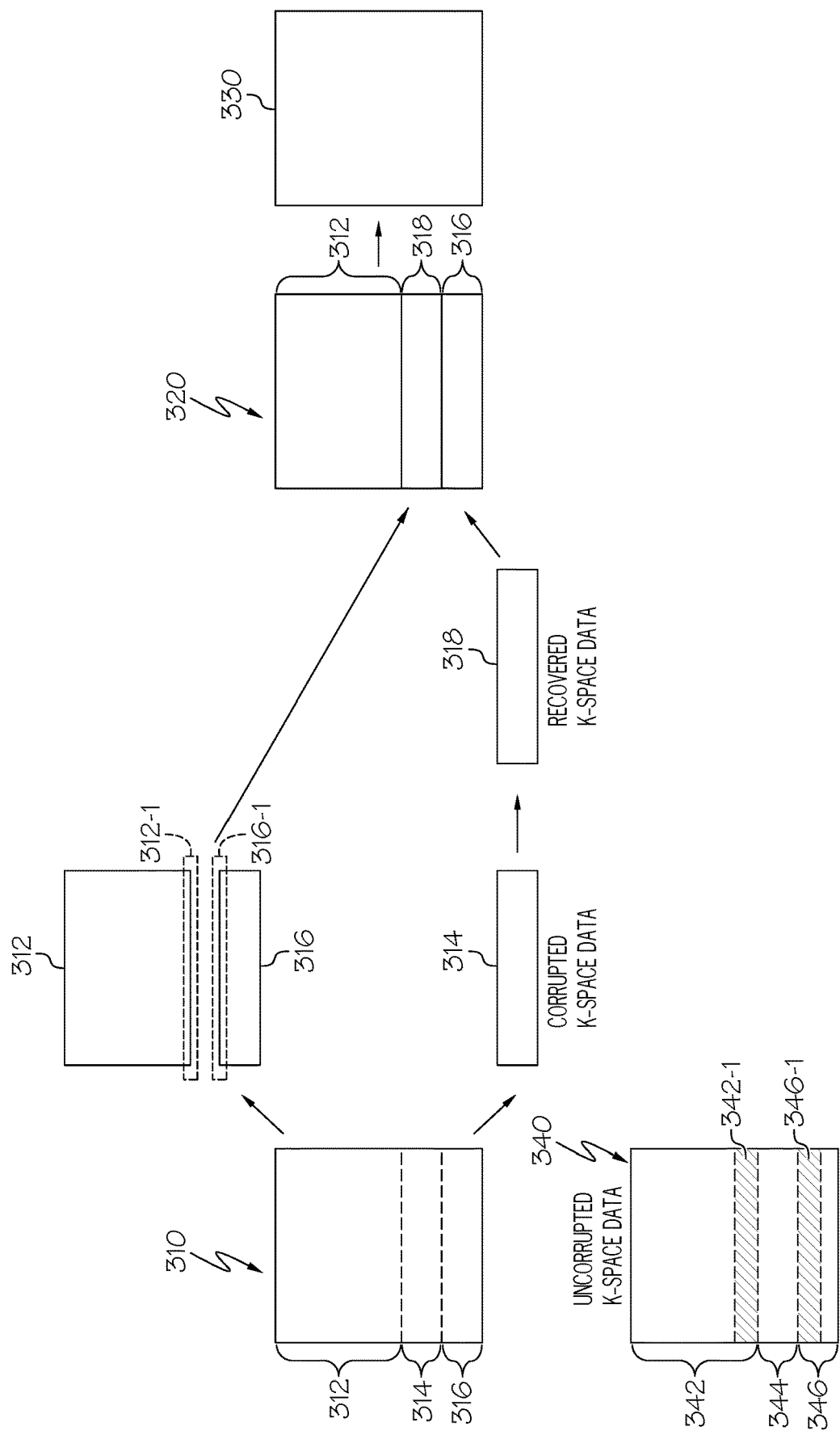
FIG. 3 is an example operation of identifying a corrupted k-space line or subset of an entire k-space dataset and recovering the corrupted k-space line or subset of the entire k-space dataset, according to one or more embodiments shown and described herein.

In step 210, the computing device 100 acquires a k-space dataset for an object using an MR scanner. In embodiments, as shown in FIG. 1, the computing device 100 receives MR signals from the transmitting and receiving unit 16 and acquires a k-space dataset for the object 9. For example, the k-space dataset 310 in FIG. 3 may be acquired.

In embodiments, the k-space dataset may be acquired in phase-encoding directions. In some embodiments, the k-space dataset is acquired in frequency-encoding directions. In some embodiments, the k-space dataset may be acquired using a combination of partial Fourier acquisition and other under-sampling techniques, such as compressed sensing and parallel imaging acquisitions.

In embodiments, the k-space dataset may be acquired with at least one of $T_1$-weighted spin echo, $T_2$-weighted spin echo, fluid-attenuated inversion-recovery, $T_1$-weighted gradient-echo, $T_2^*$-weighted gradient echo, contrast enhanced $T_1$-weighted gradient echo, contrast enhanced $T_1$-weighted spin echo, diffusion-weighted spin echo, and their variations or combinations.

In embodiments, the k-space dataset may be acquired with imaging sequence including, but not limited to, at least one of two spatial dimensional, three spatial dimensional, or three spatial dimensional plus temporal image acquisition. In some embodiments, the imaging sequence may include at least one of a gradient echo, echo planar or spin echo sequence with or without magnetization preparation, with or without under-sampling techniques, with or without parallel imaging techniques, or with or without Cartesian k-space trajectories. The imaging sequence can include at least one of two spatial dimensional, three spatial dimensional, or three spatial dimensional plus temporal image acquisition. For example, dynamic contrast agent enhanced imaging and blood oxygen level dependent functional MRI may deal with motion at the different time frames.

In embodiments, the k-space dataset may be acquired using k-space trajectory including at least one of rectilinear, echo planar, but not limited to, radial, Cartesian, non-Cartesian, Zig-Zag, stochastic, rosette, TWIRL, WHIRL and spiral trajectories. The k-space dataset may be acquired according to a k-space sampling order including at least one of a sequential sampling order, a centric sampling order, an interleave sampling order, a reverse sampling order, a random sampling order, or a hybrid sampling order.

In embodiments, the computing device 100 acquires a k-space dataset for a region of interest using an MR scanner. The region of interest may include at least a portion of a subject's body with or without disease. The portion of the subject's body may be at least one of an extremity, brain, spine, neck, chest, breast, joint, prostate, pelvis, or abdomen.

In step 220, the computing device 100 detects or identifies corrupted k-space data from the acquired k-space dataset. In embodiments, the corrupted k-space data may be either one k-space line or a subset of k-space data which includes a group of k-space lines with an identical feature or profile. For example, phase changes caused by motion of an object may accumulate for echo planar imaging and lead to corrupted k-space data of a group of k-space lines.

In embodiments, the computing device 100 detects or identifies corrupted k-space data from the acquired k-space dataset by comparing the corrupted k-space data to reference k-space data. For example, by referring to FIG. 3, the computing device 100 may compare the k-space dataset 310 with reference k-space data, and identify that the k-space data 314 is corrupted and that the k-space data 312 and k-space data 316 are not corrupted. In some embodiments, the computing device 100 detects or identifies corrupted k-space data from the acquired k-space dataset using one or more machine learning algorithms. The machine learning algorithm is trained with sample k-space datasets including corrupted k-space data.

In some embodiments, the computing device 100 detects or identifies corrupted k-space data from the acquired k-space dataset using at least one of MRI navigators, optical systems, and gradient field detection systems.

In some embodiments, the computing device 100 detects or identifies corrupted k-space data from the acquired k-space dataset using methods, such as auto-correction methods, tracking using external tracking devices, and identifying using Navigator signal. The auto-correction methods may identify the corrupted k-space data from the acquired k-space data by comparing features and profiles between the corrupted k-space data to un-corrupted k-space data. The features and profiles may be k-space consistency, but not limited to, image entropy, gradient entropy, k-space entropy, similarity and other k-space and image features.

The navigator methods may acquire position information during an imaging sequence using the MR scanner itself. This is achieved by frequently playing out ultra-short (on the order of milliseconds) navigator sequences during the imaging process. The ultra-short navigator sequences may be used to correct the corruption of a group of k-space lines. When the duration time for k-space line is comparable to the navigator sequence, it may introduce big error. External tracking devices may provide the motion information for motion correction. For example, triggering and gating correlate to the (quasi-) periodic physiologic motion in question. Electrocardiogram (ECG) and respiratory belt may be used to reduce the effect of cardiac motion and breathing motion. Additionally, stereo camera systems, miniature RF probes, in-bore camera systems, and ultrasound systems may identify and record motion information.

In step 230, the computing device 100 extracts the corrupted k-space data from the acquired k-space dataset. For example, the computing device 100 extracts the corrupted k-space data 314 from the acquired k-space dataset 310.

In step 240, the computing device 100 recovers the corrupted k-space data. By referring to FIG. 3, in embodiments, the computing device 100 may recover the corrupted k-space data 314 to obtain recovered k-space data 318. Recovering the corrupted k-space data will be described in detail with reference to FIGS. 4 and 5 below.

In step 250, the computing device 100 combines uncorrupted k-space data of the acquired k-space dataset with the recovered k-space data to form a full k-space dataset. In embodiment, by referring to FIG. 3, the computing device 100 may combine the uncorrupted k-space data 312 and 316 and the recovered k-space data 318 to from a full k-space dataset 320. The full k-space dataset 320 may not include corrupted data due to motion of the object.

In step 260, the computing device 100 reconstructs an image for the object based on the full k-space dataset. By referring to FIG. 3, the computing device 100 may reconstruct an image 330 for the object based on the full k-space dataset 320. In embodiments, the computing device 100 implements inverse-Fourier transform on the full k-space dataset to construct an image for the target area, e.g., the image 330 in FIG. 3. The acquired image may be used for diagnosis, prognosis, surrogate endpoint, or therapeutic response. In some embodiments, the acquired image may be analyzed using computer-aided diagnosis. The computer-aided diagnosis may include a quantification of at least one of volumetric, image intensity, or surface of at least a portion of a region of interest, perfusion, blood volume, flow velocity, relaxation time, diffusion coefficient, proton density, or electro-magnetic properties.

Figure 4:
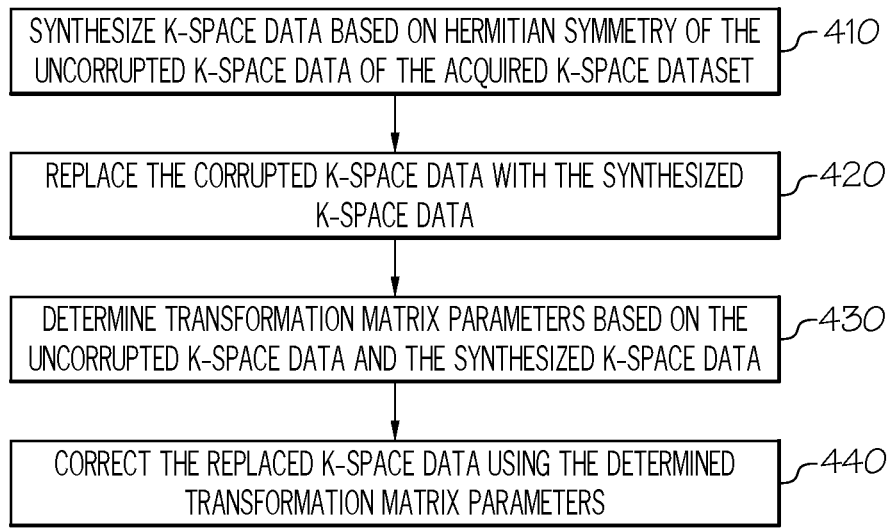
FIG. 4 is a schematic flowchart of correcting corrupted k-space data of acquired k-space dataset using Hermitian symmetry and a transformation matrix, according to one or more embodiments shown and described herein.

FIG. 4 is a schematic flowchart of correcting corrupted k-space data of acquired 2 dimensional k-space dataset using Hermitian symmetry and a transformation matrix, according to one or more embodiments shown and described herein.

In step 410, the computing device 100 synthesizes k-space data based on Hermitian symmetry of the un-corrupted k-space data of the acquired k-space dataset. By referring to FIG. 5, a k-space dataset 502 includes un-corrupted k-space data 510 and corrupted k-space data 512. Then, the computing device 100 obtains k-space data 522 which is a Hermitian symmetry of the uncorrupted k-space data 510 of the acquired k-space dataset 502. Based on the Hermitian symmetry of the k-space data 510 as in Equation (2), the synthesized k-space data 524 that corresponds to the corrupted k-space data 512 may be obtained. For example, the k-space data 522 is Hermitian symmetry of the uncorrupted k-space data 510. Then, the synthesized k-space data 524 that corresponds to the corrupted k-space data 512 (assumed $k_x \in [-k_{max}, k_{max}]$ and $k_y \in [-k_{max}, k_N]$) may be obtained out of the k-space data 522. Specifically, synthesized data $\hat{S}(k_x, k_y)$ may be obtained using complex conjugate of the uncorrupted k-space data as shown in Equation (3).

$$\hat{S}_{synthesized}(k_x, k_y) = S^*_{uncorrupted}(-k_x, -k_y) \qquad \text{Equation (3)}$$

where $k_x \in [-k_{max}, k_{max}]$ but $k_y \in [-k_{max}, k_N]$. The corrupted k-space data is $k_x \in [-k_{max}, k_{max}]$ but $k_y \in [-k_{max}, -(k_N+1)]$. The corrupted k-space data will be replaced with synthesized k-space data.

In embodiments, it may be assumed that the spin-history of k-space data is identical with regard to the uncorrupted k-space data and the synthesized k-space data. Additionally, the synthesized k-space data 524 includes the k-space data corresponding to the corrupted k-space data. The corrupted k-space data can be replaced with synthesized k-space data. As a result, full k-space dataset without motion artifacts can be formed by uncorrupted k-space data of the acquired k-space dataset and the recovered k-space data, and the image without motion artifacts can be reconstructed from the full k-space dataset.

In some embodiments, the assumption of Hermitian symmetry may not be valid when the effects of eddy currents, non-uniform radiofrequency field, non-uniform $B_0$, chemical shift, and motion gradient moments are not ignored. Therefore, it is necessary to correct the synthesized data $\hat{S}(k_x, k_y)$. This issue may be addressed by introducing a transformation matrix that is described in step 430 below.

In step 420, the computing device 100 replaces the corrupted k-space data with the synthesized or corrected k-space data. In embodiments, by referring to FIG. 5, the computing device 100 may replace the corrupted k-space data 512 with the synthesized or corrected k-space data 524.

In step 430, the computing device 100 determines transformation matrix parameters based on the un-corrupted k-space data and the synthesized k-space data. The transformation matrix may be used to correct the synthesized k-space dataset for at least one of translation or rotation. The transformation matrix may be estimated from at least one of phase, magnitude, real, and imaginary of an acquired k-space dataset and Hermitian symmetry of the acquired k-space dataset. The transformation matrix in k-space domain may include, but not limited to, at least one of an affine transform matrix, a rigid transform matrix, a linear transform matrix, a non-linear transform, and a non-rigid transform matrix.

The transformation matrix for brain is assumed to be rigid and includes rotational matrix R and translational vector $\vec{T}$. Generally, an object rotation in image domain corresponds to a similar rotation of k-space domain, while the object translation in image domain corresponds to phase shift in k-space domain. Therefore, a transformation matrix including rotational matrix R and translational vector $\vec{T}$ is enough to describe the motion of brain in k-space domain. The transformation matrix is estimated by the corresponding parts of $S_{acquired}(k_x, k_y)$ and $\hat{S}(k_x, k_y)$ using Equation (4) below:

$$\hat{S}_{synthesized}(k_x, k_y) = \hat{S}_{acquired}(R \cdot [k_x, k_y]) \cdot e^{-2\pi i (R \cdot [k_x, k_y] \cdot \vec{T})} \qquad \text{Equation (4)}$$

where $k_x \in [-k_{max}, k_{max}]$ but $k_y \in [-k_N, k_N]$.

According to the Equation (4), it is noted that both R and $\vec{T}$ contribute to the phase image of k-space data. The R may be estimated from the magnitude k-space data of the corresponding parts of $S_{acquired}(k_x, k_y)$ and $\hat{S}(k_x, k_y)$, and then translational vector $\vec{T}$ can be estimated from the phase k-space data and R. The estimated transformation matrix R and $\vec{T}$ may be implemented to correct entire synthesized k-space data as in Equation (5) below:

$$S_{corrected}(k_x, k_y) = S_{synthesized}(R \cdot [k_x, k_y]) \cdot e^{-2\pi i (R \cdot [k_x, k_y] \cdot \vec{T})} \qquad \text{Equation (5)}$$

where $k_x \in [-k_{max}, k_{max}]$ but $k_y \in [-k_{max}, k_N]$.

Figure 5:
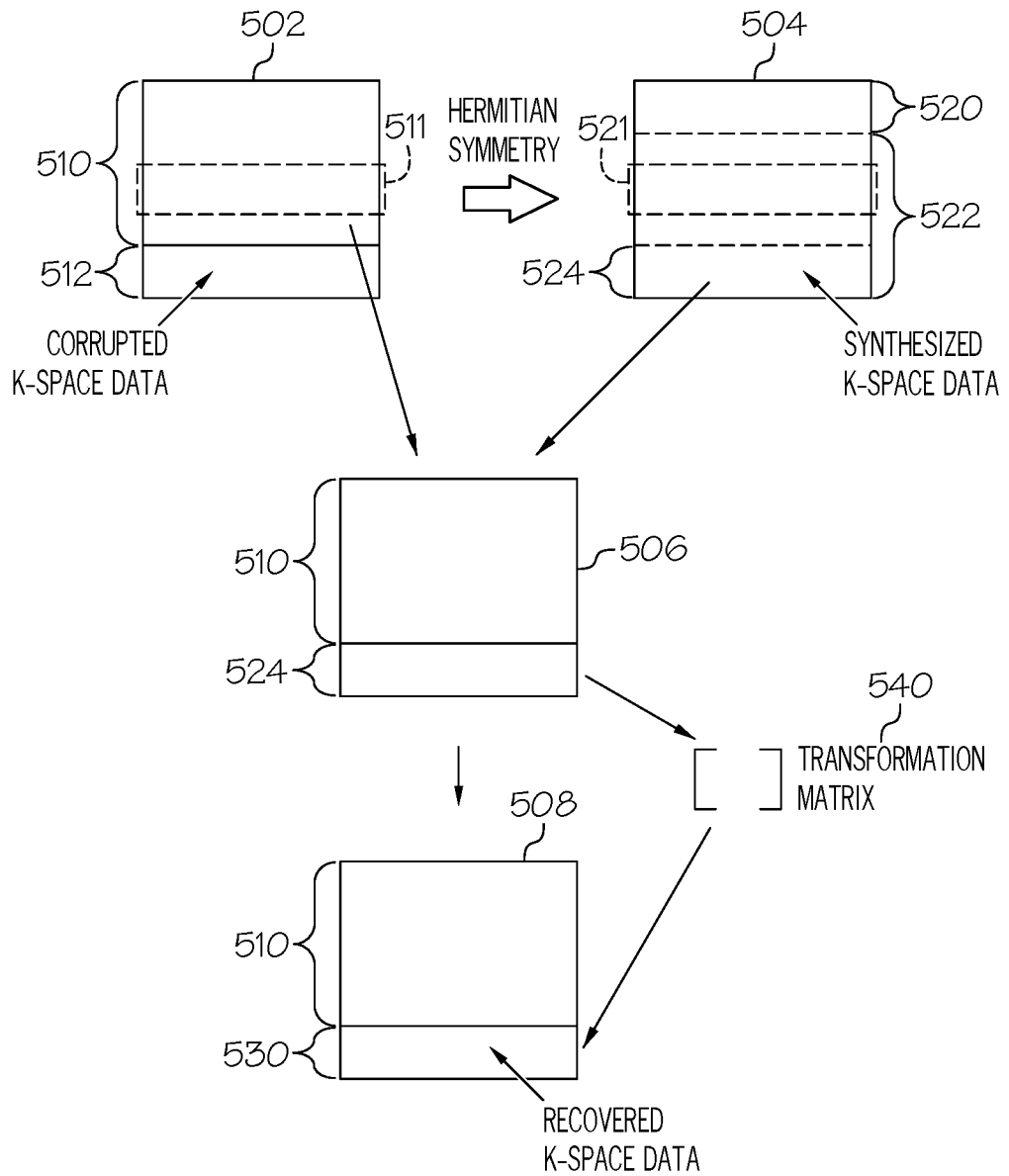
FIG. 5 is an example operation of correcting corrupted k-space data of acquired k-space dataset using Hermitian symmetry and a transformation matrix, according to one or more embodiments shown and described herein.

In embodiments, the computing device 100 may estimate the transformation matrix based on a part of the first partial k-space dataset and a corresponding part of the second partial k-space dataset. For example, the computing device compares the part 511 of the k-space dataset 502 and the part 521 of the second partial k-space dataset 504 and estimates the transformation matrix based on the difference between the part 511 and the part 521. The part 521 covers the same area in k-space as the part 511 as shown in FIG. 5, but is created based on the Hermitian Symmetry of the part 511 of the k-space dataset 502.

In step 440, the computing device 100 corrects the replaced k-space data using the determined transformation matrix parameters. In embodiments, by referring to FIG. 5, the image 506 depicts a combined image of the uncorrupted k-space data 510 and the synthesized k-space data 524. The computing device 100 may correct the synthesized k-space data 524 using the transformation matrix 540 to obtain corrected k-space data 530. Then, the computing device 100 obtains a full k-space dataset for the target area based on the corrected k-space data 530, and the uncorrupted k-space data 510. For example, a full k-space dataset 508 in FIG. 5 is obtained by combining the uncorrupted k-space data 510 and the corrected k-space data 530 that is obtained by correcting the synthesized k-space data 524 using the transformation matrix 540. Specifically, $S_{uncorrupted}(k_x, k_y)(k_x \in [-k_{max}, k_{max}], k_y \in [-k_N, k_{max}])$ is combined with a part of $S_{corrected}(k_x, k_y)(k_x \in [-k_{max}, k_{max}], k_y \in [-k_{max}, -(k_N+1)])$ to form full k-space data, e.g., the full k-space dataset 508 in FIG. 5.

In embodiments, the methods described herein may further include using the acquired image for diagnosis, prognosis, surrogate endpoint, or therapeutic response. Alternatively or additionally, the methods described herein may further include using the acquired image for computer-aided diagnosis. The computer-aided diagnosis may include a quantification of at least one of volumetric, image intensity, or surface of at least a portion of a region of interest, perfusion, blood volume, flow velocity, relaxation time, diffusion coefficient, proton density, or electro-magnetic properties.

Figure 6:
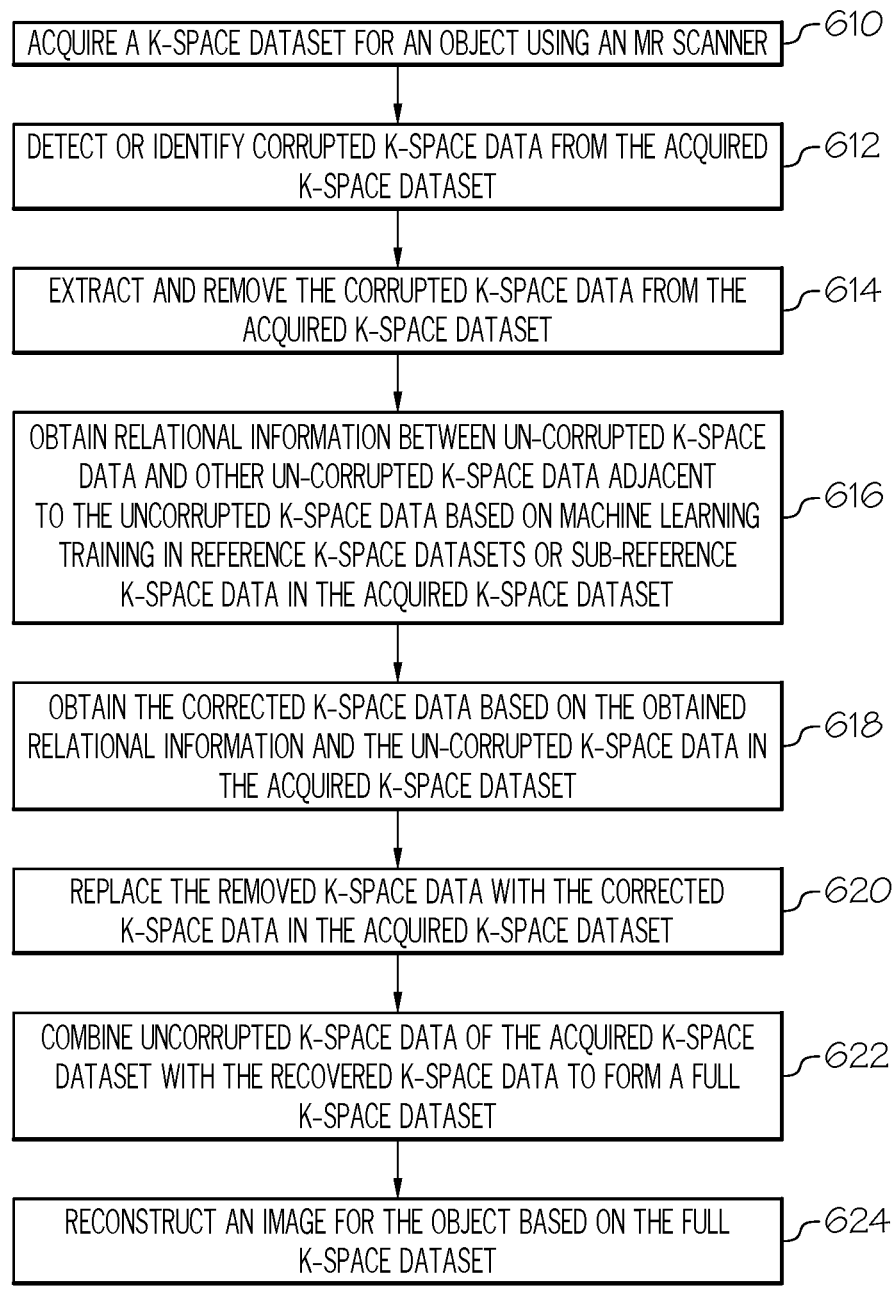
FIG. 6 a schematic flowchart of recovering corrupted k-space data of acquired k-space dataset using relational information between un-corrupted k-space data and other un-corrupted k-space data adjacent to the uncorrupted k-space data, according to one or more embodiments shown and described herein.

FIG. 6 a schematic flowchart of recovering corrupted k-space data of acquired k-space dataset using relational information between un-corrupted k-space data and other un-corrupted k-space data adjacent to the uncorrupted k-space data, according to one or more embodiments shown and described herein.

In step 610, the computing device 100 acquires a k-space dataset for an object using an MR scanner. In embodiments, as shown in FIG. 1, the computing device 100 receives MR signals from the transmitting and receiving unit 16 and acquires a k-space dataset for the object 9. For example, the k-space dataset 310 in FIG. 3 may be acquired.

In step 612, the computing device 100 detects or identifies corrupted k-space data from the acquired k-space dataset. In embodiments, the corrupted k-space data may be either one k-space line or a subset of k-space data which includes a group of k-space lines with an identical feature or profile. For example, phase changes caused by motion of an object may accumulate for echo planar imaging and lead to corrupted k-space data of a group of k-space lines.

In embodiments, the computing device 100 detects or identifies corrupted k-space data from the acquired k-space dataset by comparing the corrupted k-space data to reference k-space data. For example, by referring to FIG. 3, the computing device 100 may compare the k-space dataset 310 with reference k-space data, and identify that the k-space data 314 is corrupted and that the k-space data 312 and k-space data 316 are not corrupted. In some embodiments, the computing device 100 detects or identifies corrupted k-space data from the acquired k-space dataset using one or more machine learning algorithms. The machine learning algorithm is trained with sample k-space datasets including corrupted k-space data. In some embodiments, the computing device 100 detects or identifies corrupted k-space data from the acquired k-space dataset using at least one of MM navigators, optical systems, and gradient field detection systems.

In step 614, the computing device 100 extracts the corrupted k-space data from the acquired k-space dataset. For example, by referring to FIG. 3, the computing device 100 extracts and removes the corrupted k-space data 314 from the acquired k-space dataset 310.

In step 616, the computing device 100 obtains relational information between un-corrupted k-space data and their neighbors, i.e., other uncorrupted k-space data adjacent to the un-corrupted k-space data based on machine learning training in reference k-space datasets without any corrupted k-space data or sub-reference k-space data without any corrupted k-space data in the acquired k-space dataset. For example, by referring to FIG. 3, the computing device 100 obtains relational information (such as transformation matrix, linear relationship or non-linear relationship) between un-corrupted k-space data 344 of uncorrupted k-space dataset 340 and their neighbors (e.g., k-space data 342-1 or k-space data 346-1) adjacent to the un-corrupted k-space data 344 based on machine learning training in reference k-space datasets or sub-reference k-space data in the acquired k-space dataset. The uncorrupted k-space dataset 340 may be one example of reference k-space datasets. The k-space data 344 of the uncorrupted k-space dataset 340 may correspond to the corrupted k-space data 314, the k-space data 342 may correspond to the k-space data 312, and the k-space data 346, may correspond to the k-space data 316.

It is noticed that the relational information can be a blind box, for example, in deep learning algorithm. The training data for the blind box may include the un-corrupted k-space data from external reference k-space data or internal sub-reference k-space data in the acquired k-space dataset. The input to the blind box may be uncorrupted k-space data near a corrupted k-space data. An output of the blind box includes the k-space data corresponding to the corrupted k-space data, which is the corrected k-space data or the recovered k-space data of the corrupted k-space data.

In step 618, the computing device 100 obtains corrected k-space data based on the obtained relational information and the un-corrupted k-space data adjacent to the removed corrupted k-space data in the acquired k-space dataset. For example, by referring to FIG. 3, the computing device 100 may obtain the recovered k-space data 318 based on the relational information obtained in step 616 and the uncorrupted k-space data 312-1 or 316-1 adjacent to the removed corrupted k-space data 314.

In step 620, the computing device 100 replaces the removed k-space data with the corrected k-space data in the acquired k-space dataset.

In step 622, the computing device 100 combines uncorrupted k-space data of the acquired k-space dataset with the recovered k-space data to form a full k-space dataset. In embodiment, by referring to FIG. 3, the computing device 100 may combine the uncorrupted k-space data 312 and 316 and the recovered k-space data 318 to from a full k-space dataset 320. The full k-space dataset 320 may not include corrupted data due to motion of the object.

In step 624, the computing device 100 reconstructs an image for the object based on the full k-space dataset. By referring to FIG. 3, the computing device 100 may reconstruct an image 330 for the object based on the full k-space dataset 320. In embodiments, the computing device 100 implements inverse-Fourier transform on the full k-space dataset to construct an image for the target area, e.g., the image 330 in FIG. 3. The acquired image may be used for diagnosis, prognosis, surrogate endpoint, or therapeutic response. In some embodiments, the acquired image may be analyzed using computer-aided diagnosis. The computer-aided diagnosis may include a quantification of at least one of volumetric, image intensity, or surface of at least a portion of a region of interest, perfusion, blood volume, flow velocity, relaxation time, diffusion coefficient, proton density, or electro-magnetic properties.

It should be understood that the above-described subject matter may also be implemented as a computer-controlled apparatus, a computer process, a computing system, or an article of manufacture, such as a computer-readable storage medium. Other systems, methods, features and/or advantages will be or may become apparent to one with skill in the art upon examination of the following drawings and detailed description. It is intended that all such additional systems, methods, features and/or advantages be included within this description and be protected by the accompanying claims.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means".

The invention claimed is:

1. A method for motion correction of Magnetic Resonance (MR) images, the method comprising:
   acquiring, using a controller, a k-space dataset for an object using an MR scanner;
   detecting or identifying, using the controller, corrupted k-space data from the acquired k-space dataset;
   extracting, using the controller, the corrupted k-space data from the acquired k-space dataset;
   recovering, using the controller, the corrupted k-space data;
   combining, using the controller, un-corrupted k-space data of the acquired k-space dataset with the recovered k-space data to form a full k-space dataset;
   reconstructing, using the controller, an image for the object based on the full k-space dataset; and
   storing the image in an image data storage unit.

2. A magnetic resonance imaging (MM) system comprising:
   a magnetic field generating unit configured to apply a plurality of RF pulses with a E to a target area in an object;
   a receiver configured to receive MR signals from the target area;
   a processing unit;
   a system memory; and
   machine readable instructions stored in the system memory that, when executed by the processing unit, cause the processing unit to:
     acquire a k-space dataset for the target area based on the MR signals;
     detect or identify a corrupted k-space data from the acquired k-space dataset;
     extract the corrupted k-space data from the acquired k-space dataset;
     recover the corrupted k-space data;
     combine uncorrupted k-space data of the acquired k-space dataset with the recovered k-space data to form a full k-space dataset;
     reconstruct an image for the target area based on the full k-space dataset; and
     storing the image in an image data storage unit.

3. The method of claim 1, wherein the k-space dataset is two or three dimensional data.

4. The method of claim 1, wherein the corrupted k-space data is either one or more k-space lines or a subset of k-space data comprising a group of k-space lines with an identical feature or profile.

5. The method of claim 1, wherein detecting the corrupted k-space data further comprises:
   detecting the corrupted k-space data from the acquired k-space dataset by comparing the corrupted k-space data to reference k-space data.

6. The method of claim 1, wherein detecting the corrupted k-space data further comprises:
   detecting the corrupted k-space data from the acquired k-space dataset using machine learning algorithm, the machine learning algorithm being trained with sample k-space datasets including corrupted k-space data.

7. The method of claim 1, wherein detecting the corrupted k-space data further comprises:
   detecting the corrupted k-space data from the acquired k-space dataset using at least one of MRI navigators, optical systems, and gradient field detection systems.

8. The method of claim 1, wherein recovering the corrupted k-space data comprises:
   synthesizing k-space data based on Hermitian symmetry of the un-corrupted k-space data of the acquired k-space dataset;
   replacing the corrupted k-space data with the synthesized k-space data; and
   correcting the replaced k-space data.

9. The method of claim 8, wherein correcting the replaced k-space data comprises:
   determining transformation matrix parameters based on the un-corrupted k-space data and the synthesized k-space data; and
   correcting the replaced k-space data using the determined transformation matrix parameters.

10. The method of claim 5, wherein the reference k-space data comprises the un-corrupted k-space data from the acquired k-space dataset.

11. The method of claim 5, wherein the reference k-space data comprises low-resolution k-space data having a resolution lower than a resolution of the acquired k-space dataset; and
    the low-resolution k-space data is acquired under identical condition as the acquired k-space dataset.

12. The method of claim 5, wherein the reference k-space data comprises navigator echo.

13. The method of claim 8, wherein transformation matrix parameters represent translation, rotation, or shear data of k-space data.

14. The method of claim 1, wherein recovering the corrupted k-space data comprises:
    obtaining relational information between un-corrupted k-space data corresponding to corrupted k-space data in the acquired k-space dataset and other un-corrupted k-space data adjacent to the un-corrupted k-space data corresponding to the corrupted k-space data in the acquired k-space dataset based on machine learning training in reference k-space datasets or sub-reference k-space data in the acquired k-space dataset;
    correcting the corrupted k-space data based on the obtained relational information and the un-corrupted k-space data in the acquired k-space dataset; and
    replacing the corrupted k-space data with the corrected k-space data in the acquired k-space dataset.

15. The method of claim 1, wherein the full k-space dataset comprises the un-corrupted k-space data and the recovered corrupted k-space data.

16. The method of claim 1, wherein the k-space dataset is acquired using at least one of rectilinear, echo planar, a propeller, a blade, radial, Cartesian, non-Cartesian, Zig-Zag, stochastic, rosette, TWIRL, WHIRL and spiral trajectories.

17. The method of claim 1, wherein the k-space dataset is acquired by a combination of partial Fourier acquisition and under-sampling techniques including compressed sensing and parallel imaging acquisitions.

18. The system of claim 2, wherein the machine readable instructions stored in the system memory, when executed by the processing unit, cause the processing unit to:
- synthesize k-space data based on Hermitian symmetry of the un-corrupted k-space data of the acquired k-space dataset;
- replace the corrupted k-space data with the synthesized k-space data; and
- correcting the replaced k-space data.

19. The system of claim 18, wherein the machine readable instructions stored in the system memory, when executed by the processing unit, cause the processing unit to:
- determine transformation matrix parameters based on the un-corrupted k-space data and the synthesized k-space data; and
- correct the replaced k-space data using the determined transformation matrix parameters.

20. The system of claim 18, wherein the machine readable instructions stored in the system memory, when executed by the processing unit, cause the processing unit to:
- obtain relational information between un-corrupted k-space data corresponding to corrupted k-space data in the acquired k-space dataset and other un-corrupted k-space data adjacent to the un-corrupted k-space data corresponding to the corrupted k-space data in the acquired k-space dataset based on machine learning training in reference k-space datasets or sub-reference k-space data in the acquired k-space dataset;
- correct the corrupted k-space data based on the obtained relational information and un-corrupted k-space data in the acquired k-space dataset; and
- replace the corrupted k-space data with the corrected k-space data in the acquired k-space dataset.

* * * * *

UNITED STATES PATENT AND TRADEMARK OFFICE
CERTIFICATE OF CORRECTION

PATENT NO. : 11,835,612 B2
APPLICATION NO. : 17/437467
DATED : December 5, 2023
INVENTOR(S) : Jinghua Wang and Lili He It is certified that error appears in the above-identified patent and that said Letters Patent is hereby corrected as shown below:

In the Specification

In Column 3, Line(s) 39, delete "MM" and insert --MRI--, therefor.

In Column 19, Line(s) 46, delete "MM" and insert --MRI--, therefor.

In the Claims

In Column 21, Line(s) 32, Claim 2, delete "MM" and insert --MRI--, therefor.

In Column 21, Line(s) 35, Claim 2, after "pulses", delete "with a E".

Signed and Sealed this
Eighteenth Day of June, 2024

Katherine Kelly Vidal
*Director of the United States Patent and Trademark Office*